(12) United States Patent
Shafer et al.

(10) Patent No.: US 6,590,715 B2
(45) Date of Patent: Jul. 8, 2003

(54) OPTICAL PROJECTION SYSTEM

(75) Inventors: David R. Shafer, Fairfield, CT (US); Wilhelm Ulrich, Aalen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/754,939

(22) Filed: Jan. 4, 2001

(65) Prior Publication Data

US 2001/0050820 A1 Dec. 13, 2001

Related U.S. Application Data

(63) Continuation-in-part of application No. 09/746,728, filed on Dec. 21, 2000, now abandoned.
(60) Provisional application No. 60/171,827, filed on Dec. 21, 1999.

(51) Int. Cl.[7] .............................. G02B 9/60; G02B 9/64
(52) U.S. Cl. .................... 359/649; 359/754; 359/766
(58) Field of Search ............................... 359/754–763, 359/649–651, 766

(56) References Cited

U.S. PATENT DOCUMENTS 5,990,926 A * 11/1999 Mercado ..................... 347/247
6,104,544 A * 8/2000 Matsuzawa et al. ......... 359/649
6,349,005 B1 * 2/2002 Schuster et al. ............. 359/754

* cited by examiner

*Primary Examiner*—Scott J. Sugarman
*Assistant Examiner*—Mohammed Hasan

(57) ABSTRACT

An optical projection lens system comprising one lens with an aspherical surface and comprising a first bulge followed by a first waist followed by a second bulge, wherein the diameter of the second bulge is smaller than the diameter of the first bulge.

19 Claims, 1 Drawing Sheet

OPTICAL PROJECTION SYSTEM

CROSS-REFERENCES TO RELATED APPLICATIONS

This is a continuation-in-part of application Ser. No. 09/746,728, filed Dec. 21, 2000, now abandoned, which claims the benefit of provisional application Ser. No. 60/171,827, filed Dec. 21, 1999, now abandoned.

STATEMENT REGARDING FEDERALLY SPONSORED RESEARCH OR DEVELOPMENT

Not applicable.

BACKGROUND OF THE INVENTION

1. Technical Field

This invention generally relates to an optical projection system comprising a light source, a mask holder, a projection lens system. The projection system specifically relates to an optical projection system for photolithography used in producing microstructured devices such as integrated circuits or other semiconductor devices. During the fabrication of such devices photolithography transfers an image from an photographic mask to a resultant pattern on a semiconductor wafer. Such photolithography generally includes a light exposure process, in which a semiconductor wafer is exposed to light having information of a mask pattern. Optical projection systems are used to perform the light exposure process.

In general, the transferred mask patterns are very fine, so that optical projection systems are required to have a high resolution. The high resolution necessitates a large numerical aperture and a good correction of aberration of the optical projection system in the light exposure field.

2. Background Art

Projection lens systems used for photolithography consists of a lot of lenses, wherein the material of the lenses is very expensive. To reduce the number of needed lenses, lenses with aspherical surfaces are used.

For example some projection lens systems are proposed in the German patent application DE 198 18 444 A1 or DE 199 02 336 A1. The shown projection lens systems consists of 6 or 5 lens groups. The first, third and fifth lens group have positive refractive power. If the projection lens system consists of six lens groups, then the sixth lens group has also positive refractive power. The second and fourth lens groups have negative refractive power. To get a high resolution, in all shown examples the fourth and fifth lens groups comprises lenses with aspherical surfaces. The distance between a mask in front of the lenses of the projection lens system and a wafer behind the lenses of the projection lens system is between 1200 mm and 1500 mm. But only in some projection systems such a large track length is provided for the projection lens system.

The projection lens systems shows three bulges, or convex portions. The diameter of a bulge, i.e., convex portion, is defined by the maximum height of the principle rays, which is nearly the diameter of the used lenses. In the shown embodiments the diameter of the first bulge, i.e., convex portion, is smaller than the diameter of the third convex portion. If the projection lens system consists of six lens groups, only one bulge, i.e., convex portion, is established by the fifth and the sixth lens groups.

With increasing diameters of the needed lenses, the price of the projection lens system is getting up.

Further projection lens systems comprising aspherical surfaces are part of the patent application DE 199 422 81 A1.

SUMMARY OF THE INVENTION

It is an object of this invention to provide a further excellent optical projection lens system for photolithography with high numerical aperture and a good optical performance in respect of track length and cost effects.

A projection lens system of the invention comprises one lens with an aspherical surface. It consists of a first and a second bulge, wherein a first waist is arranged between the bulges. With a projection system comprising a second bulge, which is smaller than the first bulge, the number of needed lenses with a great diameter is reduced. To get such a design with a small second bulge at least one lens with an aspherical surface is needed.

Further the number of needed lenses can be reduced by taking a second lens group consisting of three lenses, especially three negative lenses.

Further it is helpful to have a projection lens system comprising both features, the small second bulge and the first waist consisting of three lenses.

An optical projection system of the invention comprises in a direction of the propagating ray a first lens group having positive refractive power and a second lens group having negative refractive power and establishing a first beam waist of minimal beam height. A third lens group having positive refractive power and a fourth group having negative refracting power, establishing a second beam waist. Subsequent to the second waist a fifth lens group can be divided into a first subgroup comprising an aperture stop and a second subgroup.

Two negative lenses are arranged nearby the aperture stop. Behind the first positive lens, which is arranged subsequent to the aperture stop a lens free distance follows. This lens free distance extends more than 10% of the track length of the fifth lens group or more than 4% of the track length of the projection lens system.

At least two lenses arranged behind the aperture plate comprises as aspherical surface. Further lenses comprising aspherical surfaces in all other groups will be helpful for correction of chromatic errors for such a projection lens system with such a high numerical aperture.

By taking a projection lens system with a third bulge, wherein the diameter of this bulge is at least 10% greater than the diameter of the second bulge, the cost of the projection lens system with a high numerical aperture can be reduced, because the great diameter of the last bulge is needed to get the high numerical aperture, but by taking a second bulge with a small diameter, it is possible to reduce the number of needed lenses with a great diameter, which are very expensive. So this is a good way to provide an excellent projection lens system at reduced cost.

DETAILED DESCRIPTION OF EMBODIMENT

Figure 1:
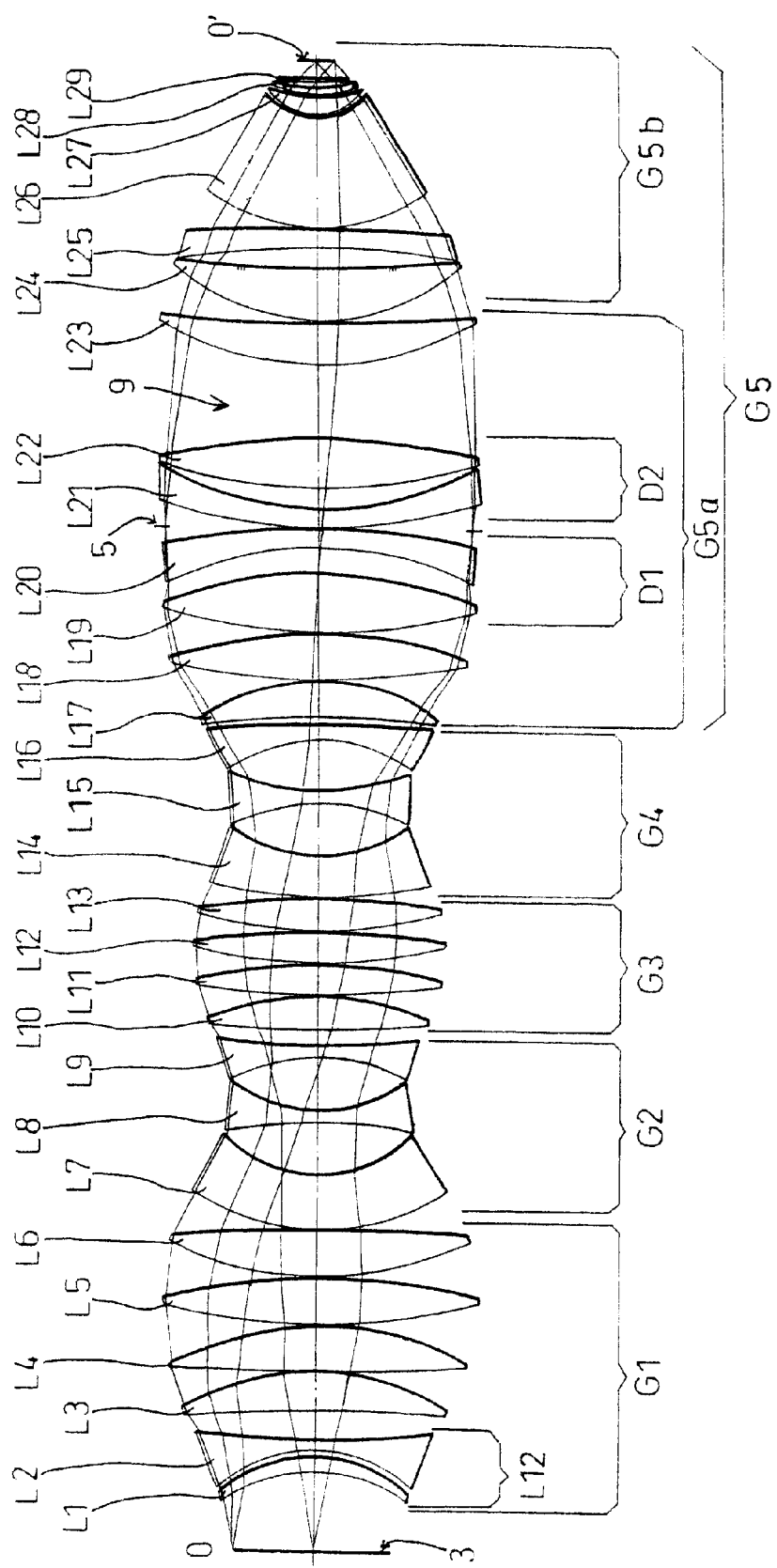
FIG. 1: A cross-section of an example of an optical projection lens system according to an embodiment of the invention.

The optical projection lens system, shown in FIG. 1, comprises 29 lenses subdivided into five lens groups G1–G5, wherein the last lens group G5 can be subdivided in first subgroup G5*a* and second subgroup G5*b*.

The shown projection lens system is used for wafer manufacture. For illuminating a mask 3, which is positioned at 0, wherein a light source with a narrow bandwidth is used. In this example of a projection system an excimer laser, which is not shown [is] in the drawing, is used. The shown projection lens system is capable to be operated at 193.3 nm with a high numerical aperture of 0.725. This projection lens system is also adaptable to be operated at other wave lengths like λ=248 nm or λ=157nm.

By using a projection system comprising this projection lens system, the scale of the structure of the mask 3 pictured on a wafer is reduced, wherein the wafer is positioned at 0'. The distance of 0 to 0' is 1050 mm and the factor of reduction is 4. The illuminated image field is rectangular, e.g. 7×20 to 15×30 mm and especially 26×13 mm.

In direction of propagating radiation this projection system comprises five lens groups G1–G5. This fifth lens group is subdivided in a first subgroup G5a and a second subgroup G5b.

A first lens group GI has positive refractive power and comprises lenses L1 to L6. A first bulge is established by this lens group G1. This first lens group G1 starts with a dispersive subgroup $L_{12}$.

The subsequent negative lens L7 is the first lens of a second lens group G2 and has a concave shaped lens surface on the image side. A first waist is established by this group G2. This second lens group G2 has negative refractive power and comprises only the three lenses L7 to L9. These three lenses L7–L9 have negative refracts power wherein two air lenses are between these lenses. A first waist 7 is established by this three lenses.

The third lens group G3 has positive refractive power and comprises lenses L10 to L13. These lenses are bi-convex lenses. A bulge is established by these four convex lenses L10 to L13. The diameter of this bulge is smaller than of the bulges established by the first lens group G1 or the arrangement. The track length of this lens group G3 is very small.

The subsequent negative lens L14 is the first lens L14 of a fourth lens group G4 and has a concave shaped lens surface on the image side. The fourth lens group has negative refractive power and comprises lenses L14 to L16. A waist is established b this lens group G4. Two nearly identically air lenses are established by this three lenses L14–L16.

Both waists comprises only three lenses, wherein each case the first lens L7, L14 is a meniscus lens. A concave lens L8, L15 is arranged in the middle of these lens groups G2, G4. The last lens L9, L16 of these lens groups G2, G4 is also a concave lens.

The subsequent positive lens L17 is the first lens of the subsequent lens group G5. This lens group has positive refractive power. This lens group comprises L17 to L29, wherein this lens group is dividable into a first subgroup G5a and a second subgroup G5b. The first subgroup G5a consists of lenses L17–L23 and the second subgroup G5b consists of lenses L24–L29. This structure of the subgroups and the division into lens groups is similar to the structure of lens groups chosen at DE 198 18 444 A1.

This lens group G5 comprises a aperture stop 5 in form of a aperture stop. The aperture stop is arranged between two lenses, L20, L22 having negative refractive power. The projection lens system comprises lenses of different materials. The lenses L17 to L19, L22, L27 and L28 are $CaF_2$ lenses, and the others of quartz glass. The $CaF_2$ lenses L18 and L19 in front of the aperture stop 5 are bi-convex lenses. The $CaF_2$ lens L22 subsequent the aperture stop 5 is a meniscus lens, which is part of an achromat. The implementation of $CaF_2$ effects a good correction of chromatic aberration of this compact embodiment. The two $CaF_2$ lenses L28 and L29 at the end of the projection lens system are inserted for their resistance versus compaction. Other materials, namely crystals and preferably fluorides with or without quartz glass, are advantageous under certain conditions.

The subgroup G5a comprises two doublets D1 and D2 neighbor to the aperture stop 5 and comprises a lens with a positive refractive power and a lens with negative power. The first doublet D1 is arranged directly in front of the aperture stop 5 and the second doublet D2 is arranged directly behind the aperture stop 5.

Behind doublet D2, which is arranged behind the aperture stop 5, a lens free distance 9 is arranged. In the shown embodiment the lens free distance 9 extends over more than 4.7% of the track length of the whole projection lens system and/or over more than 10% of the fifth lens group G5.

Two of the lenses L24, L29, which are arranged behind this lens free distance 9, comprises a aspherical surface. Both aspherical surfaces are arranged on the image side. The aspherical surfaces are useful to reduce the track length, the number of needed lenses and the needed lens material.

The lens data of this system are given in table 1.

The aspherical surfaces are described mathematically by:

$$P9h) = \delta^* h^2 + C_1 h^4 + \ldots + C_n h^{2n+2+}$$

$$1 + 1 - (1 - EX)^* \delta^{2*} h^2$$

with δ=1/R, wherein R is the paraxial curvature and P is the sag as a function of the radius h. This embodiment has a numerical aperture of 0.725.

As those skilled in the art of optical projection systems will readily appreciate numerous substitutions, modifications and additions may be made to the above design without departing from the spirit and scope of the present invention. It is intended that all such substitutions, modification, and addition falls within the scope of the invention, which is defined by the claims.

TABLE 1

| Lens | Radius | Thickness | Materials |
|---|---|---|---|
| L1 | −111.14 | 12.00 | $SiO_2$ |
|  | −102.11 | 3.47 |  |
| L2 | −99.94 | 8.00 | $SiO_2$ |
|  | 775.47 | 19.10 |  |
| L3 | −1169.68 | 26.61 | $SiO_2$ |
|  | −190.31 | 0.75 |  |
| L4 | −7538.92 | 28.78 | $SiO_2$ |
|  | −242.35 | 0.75 |  |
| L5 | 453.73 | 31.84 | $SiO_2$ |
|  | −497.77 | 0.75 |  |
| L6 | 225.79 | 34.83 | $SiO_2$ |
|  | −2018.96 | 0.75 |  |
| L7 | 160.01 | 41.42 | $SiO_2$ |
|  | 90.15 | 37.29 |  |
| L8 | −351.08 | 9.00 | $SiO_2$ |
|  | 107.55 | 35.72 |  |
| L9 | −141.02 | 9.00 | $SiO_2$ |
|  | 490.20 | 12.18 |  |
| L10 | 1155.98 | 22.67 | $SiO_2$ |
|  | −209.81 | 0.75 |  |
| L11 | 551.99 | 21.87 | $SiO_2$ |
|  | −373.78 | 0.75 |  |
| L12 | 330.61 | 22.98 | $SiO_2$ |
|  | −647.96 | 0.75 |  |
| L13 | 305.08 | 23.38 | $SiO_2$ |
|  | −551.50 | 0.75 |  |
| L14 | 347.08 | 29.51 | $SiO_2$ |
|  | 101.2 | 36.61 |  |

TABLE 1-continued

| Lens | Radius | Thickness | Materials |
|---|---|---|---|
| L15 | −144.92 | 9.00 | SiO$_2$ |
|  | 155.79 | 36.69 |  |
| L16 | −108.51 | 10.00 | SiO$_2$ |
|  | −1179.35 | 3.68 |  |
| L17 | −662.63 | 26.99 | CaF$_2$ |
|  | −144.04 | 0.75 |  |
| L18 | 456.34 | 34.51 | CaF$_2$ |
|  | −318.08 | 0.75 |  |
| L19 | 416.57 | 40.87 | CaF$_2$ |
|  | −292.52 | 18.08 |  |
| L20 | −242.77 | 13.00 | SiO$_2$ |
|  | −524.81 | 0.75 |  |
| L21 | 385.18 | 13.00 | SiO$_2$ |
|  | 220.24 | 13.94 |  |
| L22 | 364.81 | 35.85 | CaF$_2$ |
|  | −480.53 | 52.96 |  |
| L23 | 219.93 | 30.56 | SiO$_2$ |
|  | 1283.35 | 0.75 |  |
| L24 | 155.63 | 36.96 | SiO$_2$ |
|  | 879.47 | 15.64 | aspheric |
| L25 | −545.45 | 11.00 | SiO$_2$ |
|  | −3729.69 | 0.75 |  |
| L26 | 128.68 | 79.53 | SiO$_2$ |
|  | 47.35 | 0.75 |  |
| L27 | 43.60 | 12.98 | CaF$_2$ |
|  | 102.23 | 0.75 |  |
| L28 | 84.41 | 5.89 | CaF$_2$ |
|  | 181.53 | 3.04 | aspheric |
| L29 | — | 2.00 | CaF$_2$ |
|  |  | 12.00 |  | asphere at L24:
EX = 0
C1 = 1.093201e-08
C2 = −9.763422e-13
C3 = 1.292451e-17
C4 = 6.387609e-22
asphere at L28:
EX = 0
C1 = 7.093201e-08
C2 = 8.638494e-12
C3 = −6.726737e-14
C4 = 2.510662e-17

What is claimed is:

1. An optical projection lens system comprising a lens with an aspherical surface and comprising in a direction of propagating rays from an object side to an image side:
    a first convex portion followed by
    a first constriction portion followed by
    a second convex portion,
    followed by a second constriction portion
    followed by a third constriction portion
    wherein the diameter of the second convex portion is smaller than the diameter of the first convex portion, and
    wherein the diameter of each convex portion is defined by the maximum height of a principal rays.

2. An optical projection lens system according to claim 1 comprising in the direction of the propagating rays from the object side to the image side:
    a first lens group having positive refractive power,
    a second lens group having negative refractive power,
    a third lens group having positive refractive power,
    a fourth lens group having negative refractive power, and
    a fifth lens group having positive refractive power,
    wherein the second lens group Consists of three lenses.

3. An optical projection lens system according to claim 1 comprising a lens with an aspherical surface and comprising in the direction of the propagating rays from the object side to the image side:
    a first lens group having positive refractive power,
    a second lens group having negative refractive power,
    a third lens groups having positive refractive power,
    a fourth lens group having negative refractive power, and
    a fifth lens group having positive refractive power,
    wherein the second lens group consists of three lenses.

4. An optical projection lens system according to claim 2, wherein the three lenses have negative refractive power.

5. An optical projection lens system according to claim 1, further comprising an aperture stop and a wafer, wherein at least one aspherical surface is arranged between the aperture stop and the wafer.

6. An optical projection lens system according to claim 2, wherein the fifth lens system comprises a first subgroup and a second subgroup, and
    wherein at least one lens of the second subgroup comprises an aspherical surface.

7. An optical projection lens system according to claim 2, wherein the fifth lens group comprises an aperture stop,
    wherein a lens free distance is arranged subsequent to a first positive lens, and subsequent to the aperture stop.

8. An optical projection lens system according to claim 7, wherein the lens free distance extends over more than 4.5% of the track length of the projection lens system.

9. An optical lens projection system according to claim 7, wherein the lens free distance extends over more than 10% of the track length of the fifth lens group.

10. An optical lens projection system according to claim 6, wherein at least two lenses, which are arranged in the second subgroup, comprise aspherical surfaces.

11. An optical projection lens system according to claim 1, wherein the numerical aperture is greater than 0.65, preferably 0.7 and more.

12. An optical projection lens system according to claim 1, wherein the first lens group starts with a dispersive subgroup.

13. An optical projection lens system according to claim 1, wherein two different lens materials are provided for chromatic correction.

14. An optical projection lens systems according to claim 1, wherein a fluoride, especially CaF$_2$, is a lens material used for 193 nm wave length.

15. An optical projection lens system according to claim 1, wherein at least one of the two last lenses of the fifth lens group comprises a CaF$_2$ lens.

16. An optical projection lens system according to claim 1, comprising 29 lenses, and having a numerical aperture equal to or greater than 0.725.

17. Process for producing microstructured devices, comprising the steps of exposing a wafer having a light sensitive layer with UV-light using all optical projection lens system of claim 1, and
    using a mask for defining a structure of the device, whereby the light sensitive layer is developed to obtain a microstructured device.

18. An optical projection lens system comprising a lens with an aspherical surface and comprising in a direction of propagating rays from an object side to an image side:
    a first convex portion followed by
    a first constriction portion followed by
    a second convex portion followed by
    a second constriction portion followed by
    a third convex portions wherein the diameter of the third convex portion is at least 10%, greater than the diameter of the second convex portion, and wherein the diameter of each convex portion is defined by the maximum height of a principle ray.

19. An optical projection lens system comprising a lens with an aspherical surface and comprising in a direction of propagating rays from an object side to an image side:

a first convex portion followed by a first constricted portion followed by a second convex portion, wherein the diameter of the second convex portion is smaller than diameter of the first convex portion, more than 10%, and wherein the diameter of the convex portions are defined by the maximum height of a principle ray.

* * * * *